United States Patent [19]
Wang et al.

[11] Patent Number: 4,972,374
[45] Date of Patent: Nov. 20, 1990

[54] OUTPUT AMPLIFYING STAGE WITH POWER SAVING FEATURE

[75] Inventors: Karl L. Wang; Mark D. Bader, both of Austin, Tex.

[73] Assignee: Motorola, Inc., Schaumburg, Ill.

[21] Appl. No.: 457,646

[22] Filed: Dec. 27, 1989

[51] Int. Cl.$^5$ ............................ G11C 7/06; G11C 5/14
[52] U.S. Cl. ................................ 365/205; 365/189.11; 365/207; 365/227; 365/233.5
[58] Field of Search ...................... 365/227, 233.5, 205, 365/207, 189.11

[56] References Cited

U.S. PATENT DOCUMENTS

| | | | |
|---|---|---|---|
| 4,616,342 | 10/1986 | Miyamoto | 365/205 |
| 4,716,550 | 12/1987 | Flannagan et al. | 365/207 |
| 4,730,280 | 3/1988 | Aoyama | 365/205 |
| 4,845,381 | 7/1989 | Cuevas | 365/189.11 |
| 4,918,658 | 4/1990 | Shah et al. | 365/233.5 |

OTHER PUBLICATIONS

"Two Novel Power-Down Circuits on the 1 Mb CMOS SRAM", by Mastaka Matsui, et al in the 1988 Symposium On VLSI Circuits, Digest of Technical Papers, Circuit Symposium, Tokyo, IEEE Cat. No. 88 Th 0227-9, pp. 55 and 56.

*Primary Examiner*—Joseph E. Clawson, Jr.
*Attorney, Agent, or Firm*—James L. Clingan, Jr.

[57] ABSTRACT

A memory uses address transition detection to reduce power consumption of the output amplification stage. The output amplification stage, which drives an output driver, has a series of stages which are disabled except when there is an address transition. When there is an address transition all of the stages are quickly enabled except the last stage. The last stage has its output clamped to an invalid state when the other stages are first enabled and then is enabled a predetermined time after the other stages are enabled. The output of the last stage is sensed by a detector. After the last stage has been enabled and is providing valid data, the detector detects that the output of the last stage is valid, and the series of stages are all disabled. The output driver latches the data and provides an output. The output stage is thus disabled and thus not wasting power except during the portion of a cycle when there is actual need for amplification. The stage at which valid data is detected, which is the last stage, is clamped and disabled at the beginning of the cycle to ensure that the detector does not detect, as being valid, data that is invalid.

19 Claims, 1 Drawing Sheet

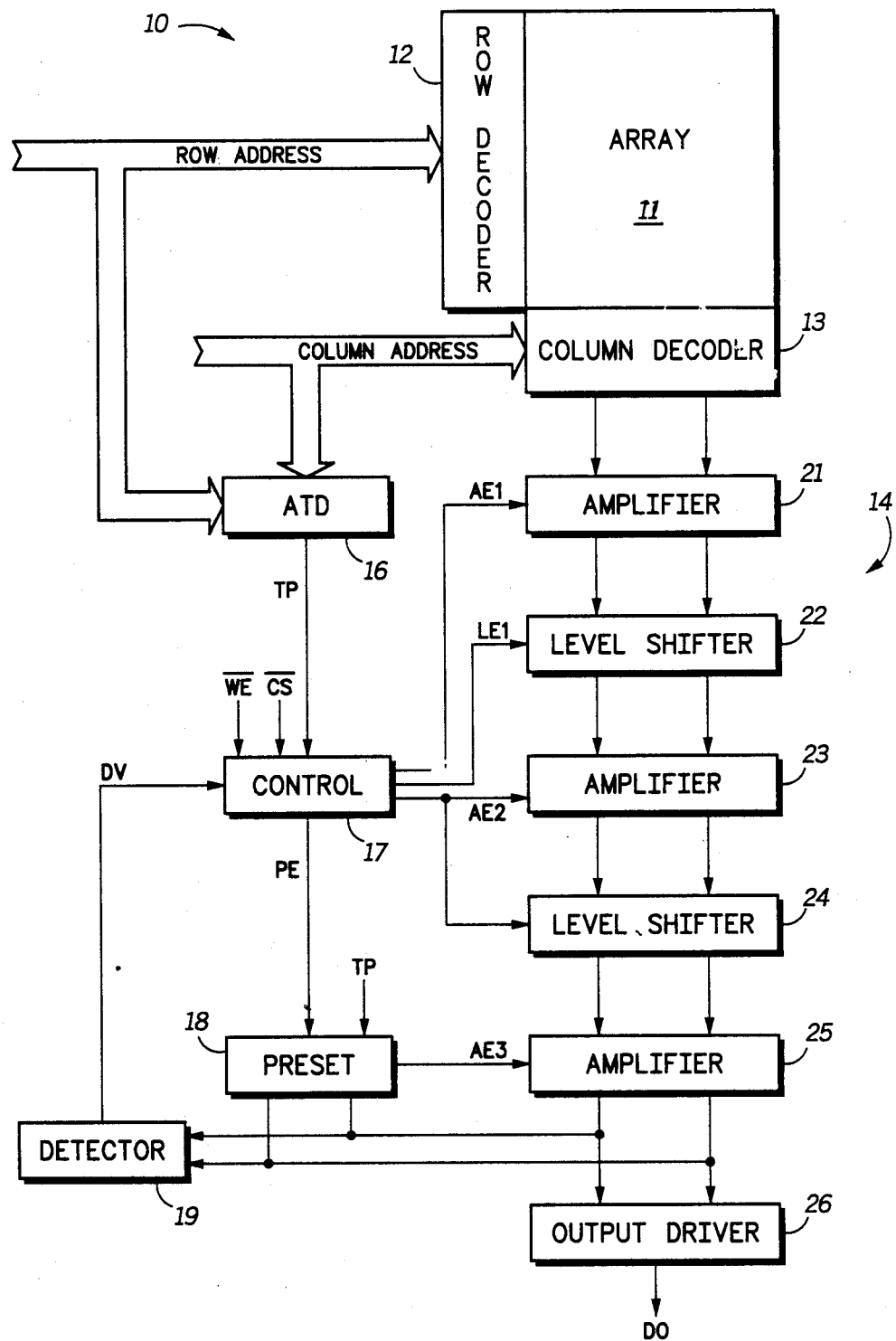

OUTPUT AMPLIFYING STAGE WITH POWER SAVING FEATURE

FIELD OF THE INVENTION

The invention relates memories, and more particularly, to the output amplifying stage of a memory.

BACKGROUND OF THE INVENTION

One of the critical aspects of a memory is the signal path from a selected memory cell to the output. The memory cell produces a relatively small signal to indicate a particular logic state which comprises one bit of information. This small signal is amplified through a number of stages and finally output as a relatively strong output signal. The strength of the signal primarily relates to voltage level and current drive capability. The signal from the memory cell is generally weak in both voltage and current drive, and thus the need for amplification. This amplification is necessary, but the amplification path is also a critical path in determining the speed with which the memory can operate. Thus, it is desirable to perform the needed amplification as quickly as possible. Generally, there is a speed/power tradeoff. Thus, the speed of amplification for a particular circuit type can be increased but at the cost of using more power. There are two major components of power usage, standby and active. The active power tends to increase as the frequency increases. Thus, at some maximum frequency of operation, the memory is using maximum power for a given power supply voltage. The maximum power that can be consumed is a function of how well heat can be dissipated. If the heat becomes too great, the memory can experience various problems including actually permanently damaging the particular memory device. Thus, it is desirable to save power whenever it is feasible, especially if it can be done without degrading the performance of the memory device.

The amplification stage, particularly at high frequency, is a major contributor to the overall power consumed by the device. This is due to a large extent because speed of amplification is so important. There are power saving techniques available but they generally have only nominal affect at the higher frequencies of operation. One such technique is to power down the amplifier stage some predetermined time after an address transition. Another approach has been to power-up the sense amplifier stage with a transition signal initiated by an address transition, detect when the output is valid, and disable the transition signal in response to detecting that the output is valid. This is described in "Two Novel Power-Down Circuits on the 1 Mb CMOS SRAM," by Masataka Matsui, et al., in the 1988 Symposium On VLSI Circuits, Digest of Technical Papers, Circuits Symposium, Tokyo, IEEE Cat. No. 88 Th 0227-9, pages 55 and 56. This approach continues to offer power-savings benefits even at higher frequencies. There are, however, some problems with this approach. One problem is that the data can give a false reading of validity. The point in the amplification stage at which the validity is detected may have a voltage movement which is sufficient to cause the validity detector to falsely detect that the data is valid. This can happen due to noise in the system which is amplified or to unbalanced bit lines which begin with a differential which opposite to that which will be eventually established for valid data. If the detector falsely detects that the data is valid, the sense amplifier will be disabled prematurely.

SUMMARY OF THE INVENTION

Accordingly, it is an object of the present invention to provide an improved output amplifying stage for a memory.

Another object of the invention is to provide an improved output amplifier of a memory with power saving feature.

In carrying out these and other objects of the invention, there is provided, in one form, a memory having an array of memory cells, each memory cell for containing data therein in the form of a first pair of differential signals; a decoder circuit for selecting a memory cell in response to an address; a transition detection circuit for providing a transition pulse in response to a transition of the address; and an output circuit. The output circuit comprises a first sense amplifier, a second sense amplifier, an output driver, a data detection circuit, a preset circuit, and a first control circuit. The first sense amplifier receives data from the selected memory cell and provides a second pair of differential signals representative of the data received from the selected memory cell. The second sense amplifier receives the second pair of differential signals and provides a third pair of differential signals. The output driver receives the third pair of differential signals and provides an output of the memory. The detection circuit provides a detection signal in response to the second pair of differential signals becoming valid. The preset circuit disables the second sense amplifier and sets the second pair of differential signals to an invalid state for a predetermined time after the transition pulse and disables the second sense amplifier in response to the detection signal. The first control circuit enables the first sense amplifier in response to the transition pulse and disables the first sense amplifier in response to the detection signal.

BRIEF DESCRIPTION OF THE DRAWINGS

The FIGURE is a block diagram of a memory according to a preferred embodiment of the invention.

DETAILED DESCRIPTION OF THE INVENTION

Shown in FIG. 1 is a memory 10 comprised generally of an array 11, a row decoder 12, a column decoder 13, an amplification stage 14, an address transition detector (ATD) 16, a control circuit 17, a preset circuit 18, and a detector 19. Amplification stage 14 comprises an amplifier 21, a level shifter 22, an amplifier 23, a level shifter 24, an amplifier 25, and an output driver 26. Array 11 contains a plurality of static random access memory (SRAM) cells located at intersections of word lines and bit line pairs. Row decoder 12 selects a word line in array 11 as determined by a row address. When memory 10 is in a read mode as indicated by signal WE being at a logic high, column decoder 13 couples a selected bit line pair, as determined by a column address, to amplifier. The data contained in the memory cell coupled to the selected word line and to the selected bit line pair is thereby communicated to amplifier 21 in the form of a voltage differential developed on the selected bit line pair. When enabled by an amplifier enable signal AE1 being active, amplifier 21 amplifies the voltage differential input thereto and provides an amplified voltage differential to level shifter 22. When enabled by a level shift enable signal LE1 being active, level shifter 22 shifts the voltage level of the voltage differential provided by amplifier 21 and outputs the level-shifted voltage differential to amplifier amplifier 23. When enabled by an amplifier enable signal AE2 being active, amplifier 23 amplifies the level-shifted voltage differential provided by level shifter 22 and provides an amplified voltage differential to level shifter 24. When enabled by amplifier enable signal AE2 being active, level shifter 24 shifts the voltage level of the voltage differential provided by amplifier 23 and outputs the level-shifted voltage differential to amplifier amplifier 25. When enabled by an amplifier enable signal AE3 being active, amplifier 25 amplifies the level-shifted voltage differential provided by level shifter 24 and provides an amplified voltage differential to output driver 26 which provides a data output signal DO representative of the logic state of the selected memory cell.

Amplifier stage 14 is active only when memory 10 is in the read mode and is selected to be active. Memory 10 is placed into the read mode under the control of the write enable signal WE and is selected to be active under the control of a chip select signal CS. Memory 10 is in the read mode when write enable signal WE is a logic high and chip select signal CS is a logic low. Control circuit 17 provides signals PE, AE1, AE2, and LE1 in either an active state or an inactive state. If memory 10 is not in the read mode, control circuit 17 provides signals PE, AE1, AE2, and LE1 in the inactive state. In the read mode control circuit 17 provides signals PE, AE1, AE2, and LE1 in the active state in response to transition pulse TP becoming active. Control circuit 17 responds to a data valid signal DV being active by making signals PE, AE1, AE2, and LE1 inactive.

Preset Circuit 18 provides signal AE3 in either an active or an inactive state under the control of transition pulse TP and preset enable signal PE. Preset circuit 18 provides signal AE3 in an inactive state in response to signal PE being provided in an inactive state. For the case in which signal PE is active, signal AE3 will be provided in the active state a predetermined time following transition pulse TP becoming active. This predetermined time is conveniently a delay period following transition pulse becoming inactive. In the read mode preset circuit 18 clamps both outputs of amplifier 25 to ground in response to signal TP being active and releases this clamping so that the output of amplifier 25 can become valid in response to transition pulse TP becoming inactive. ATD circuit 16 provides transition pulse TP in an active state for any address transition, either row or column, for about 5 nanoseconds. Detector 19 detects when the outputs of amplifier 25 provide a sufficient voltage differential to be considered valid data. When the output of amplifier 25 is thus detected as valid, detector 19 provides signal DV in an active state, otherwise detector 19 provides signal DV in an inactive state.

Prior to an address transition but after a read has been performed, output driver 26 has latched the logic state of the selected memory cell and is providing output signal DO at the logic state representative of the selected memory cell. In this condition, detector 19 has detected that the output of amplifier 25 had been valid and thus provided signal DV in an active state. Pulse TP is inactive so that control circuit 17 is providing signals AE1, AE2, PE, and LE1 in an inactive state. Thus, amplifier 21, level shifter 22, amplifier 23, and level shifter 24 are disabled. Similarly, preset circuit 18 is providing signal AE3 in an inactive state which results in amplifier 25 being disabled.

To select a different memory cell, there will be an address transition which is detected by ATD circuit 16. While the memory cell is being selected, ATD circuit 16 generates transition pulse TP. Control circuit 17 responds by activating amplifier 21, level shifter 22, amplifier 23, and level shifter 24 by providing signals AE1, AE2, and LE1 in an active state. Thus, by the time the newly selected cell is providing a voltage differential to amplifier 21, amplifier 21 is enabled and ready to amplify the newly provided voltage differential. Control circuit 17 also responds by providing signal PE in an active state. Preset circuit 18 is thus simultaneously receiving signal PE and pulse TP in their respective active states. Preset circuit 18 responds by maintaining signal AE3 in the inactive state and clamping the outputs of amplifier 25 to an invalid state. With amplifier 25 providing an invalid output, detector 19 provides signal DV in the inactive state. Amplifiers 21 and 23 and level shifters 22 and 24 provide their respective amplification and level shifting functions while pulse TP is active and amplifier 25 is disabled. After a short delay time following the termination of pulse TP, preset circuit 18 outputs signal AE3 in an active state and terminates the clamping of the output of amplifier 25. Thus, by the time level shifter 24 is providing a valid voltage differential derived from the newly selected cell, amplifier 25 is enabled and can provide an amplified voltage differential to output driver 26. When amplifier 25 does provide a voltage differential detected by detector 19, detector 19 responds by providing signal DV in the active state which causes control circuit 17 to provide signals PE, AE1, AE2, and LE1 in the inactive state which in turn disables amplifiers 21 and 23 and level shifters 22 and 24. Preset circuit 18 responds to signal PE being inactive by providing signal AE3 in the inactive state and thus disabling amplifier 25. Output driver 26 includes a latch which latches the output of amplifier 25 in response to the data provided by amplifier 25 being valid. This latching action of output driver 26 is released in response to a new address transition. This latch of output driver 26 is disabled in response to an address transition and enabled in response to the output of amplifier 25 which is thus complementary in operation to the operation of amplifiers 21 and 23 and level shifters 22 and 24 which are active in response to an address transition and disabled in response to the output of amplifier 25 being valid. The control of this latching operation of output driver 26 is not shown in the figure.

Amplification stage 14 can thus be viewed as divided into three stages. Amplifiers 21 and 23 and level shifters 22 and 24 can be viewed as a first stage of amplification that begins amplifying in response to an address transition. Amplifier 25 can be viewed as a second stage of amplification which is disabled for a predetermined delay time after the first stage is enabled and then enabled. There is thus a time during which the first stage is enabled and the second stage is disabled. During this time period, the output of the second stage is clamped to an invalid state and released thereafter. Output driver 26 can be viewed as the the third stage which responds to the output of the second stage and provides an output of the memory. Both the first and second amplification stages are disabled in response to the output of the second stage becoming valid. This saves substantial current in the first and second amplification stages. Further-more, the timing of the enabling of amplifier 25 can be adjusted so there is no delay in the propagation of the differential signal to the output of amplifier 25 but also that the first amplification stage has resolved which direction the differential voltage will be provided. Thus, although there may be an initial imbalance through the first amplification stage, that imbalance will not be provided to the output of amplifier 25 because amplifier 25 is disabled and its output is clamped during the initial time period. By the time the second amplification stage is enabled and its output released, the first amplification stage has fully resolved the output that is to be provided. Thus, amplifier 25 never provides an output that is invalid except when it is clamped to the particular known invalid state. Thus, detector 19 can be made as sensitive as desirable in detecting a differential at the output of amplifier 25 without concern that the output would be providing a false voltage differential.

While the invention has been described in a specific embodiment, it will be apparent to those skilled in the art that the disclosed invention may be modified in numerous ways and may assume many embodiments other than those specifically set out and described above. For example, more or less stages of amplification could be employed. Accordingly, it is intended by the appended claims to cover all modifications of the invention which fall within the true spirit and scope of the invention.

I claim:

1. In a memory having an array of memory cells, each memory cell for containing data therein in the form of a first pair of differential signals; decoder means for selecting a memory cell in response to an address; and transition detection means for providing a transition pulse in response to a transition of the address, an output circuit comprising:
   a first sense amplifier for receiving data from the selected memory cell and for providing a second pair of differential signals representative of the data received from the selected memory cell;
   a first level shifter for receiving the second pair of differential signals and for providing a third pair of differential signals;
   a second sense amplifier for receiving the third pair of differential signals and for providing a fourth pair of differential signals;
   a second level shifter for receiving the fourth pair of differential signals and for providing a fifth pair of differential signals;
   a third sense amplifier for receiving the fifth pair of differential signals and for providing a sixth pair of differential signals;
   an output driver for receiving the sixth pair of differential signals and for providing an output of the memory;
   preset means for clamping the sixth pair of differential signals to a predetermined voltage in response to a preset pulse;
   detection means for providing a detection signal in response to the sixth pair of differential signals becoming valid;
   first control means for providing, in response to the transition pulse, a first enable signal to the first sense amplifier a second enable pulse to the second sense amplifier, and the preset pulse;
   second control means for providing the third enable signal in response to termination of the preset pulse; and
   third control means for terminating the first, second, and third enable signals in response to the detection signals.

2. In a memory having an array of memory cells, each memory cell for containing data therein in the form of a first pair of differential signals; decoder means for selecting a memory cell in response to an address; and transition detection means for providing a transition pulse in response to a transition of the address, an output circuit comprising:
   a first sense amplifier for receiving data from the selected memory cell and for providing a second pair of differential signals representative of the data received from the selected memory cell;
   a second sense amplifier for receiving the second pair of differential signals for providing a third pair of differential signals;
   an output driver for receiving the third pair of differential signals and for providing an output of the memory;
   detection means for providing a detection signal in response to the second pair of differential signals becoming valid;
   preset means for disabling the second sense amplifier and setting the second pair of differential signals to an invalid state for a predetermined time after the transition pulse and for disabling the second sense amplifier in response to the detection signal; and
   first control means for enabling the first sense amplifier in response to the transition pulse and disabling the first sense amplifier in response to the detection signal.

3. In a memory having an array of memory cells, each memory cell for containing data therein in the form of a first pair of differential signals; decoder means for selecting a memory cell in response to an address; and transition detection means for providing a transition pulse in response to a transition of the address, a first sense amplifier for receiving data from the selected memory cell and for providing a second pair of differential signals representative of the data received from the selected memory cell; a second sense amplifier for receiving the second pair of differential signals for providing a third pair of differential signals; an output driver for receiving the third pair of differential signals and for providing an output of the memory; a method for enabling and disabling the first and second amplifier means, comprising the steps of:
   enabling the first sense amplifier in response to the transition detection means providing the transition pulse;
   disabling the second sense amplifier and setting the second pair of differential signals to an invalid state for a predetermined time after the transition pulse;
   enabling the second sense amplifier after the predetermined time after the transition pulse;
   detecting if the output of the second amplifier is valid; and
   disabling the first sense amplifier in response to detecting that the output of the second amplifier is valid.

4. In a memory having an array of memory cells, each memory cell for containing data therein; decoder means for selecting a memory cell in response to an address; a first sense amplifier for receiving data from the selected memory cell and for providing an output representative of the data received from the selected memory cell; a second sense amplifier for receiving the output of the first sense amplifier and for providing an output; an output driver for receiving the output of the second sense amplifier and for providing an output of the memory; a method for enabling and disabling the first and second sense amplifiers, comprising the steps of:

enabling the first sense amplifier in response to a transition of the address;
disabling the second sense amplifier and setting the second pair of differential signals to an invalid state for a predetermined time after first sense amplifier has been anabled;
enabling the second sense amplifier after the predetermined time;
releasing the output of the second sense amplifier after the predetermined time;
detecting if the output of the second amplifier is valid; and
disabling the first sense amplifier in response to detecting that the output of the second sense amplifier is valid.

5. The method of claim 4 further comprising the step of disabling the second sense amplifier in response to detecting that the output of the second sense amplifier is valid.

6. In a memory having an array of memory cells, each memory cell for containing data therein; decoder means for selecting a memory cell in response to an address; a first sense amplifier having a plurality of stages, for receiving data from the selected memory cell, and for providing an output representative of the data received from the selected memory cell; a second sense amplifier for receiving the output of the first sense amplifier and for providing an output; an output driver for receiving the output of the second sense amplifier and for providing an output of the memory; a method for enabling and disabling the first and second sense amplifiers, comprising the steps of:

enabling the stages of the first sense amplifier in response to a transition of the address;
disabling the second sense amplifier and setting the output of the second sense amplifier to an invalid state for at least a predetermined time after at least some of the stages of the first sense amplifier have been enabled;
enabling the second sense amplifier after the predetermined time; releasing the output of the second sense amplifier after the predetermined time;
detecting if the output of the second amplifier is valid; and
disabling the stages of the first sense amplifier in response to detecting that the output of the second sense amplifier is valid.

7. The method of claim 6 further comprising the step of disabling the second sense amplifier in response to detecting that the output of the second sense amplifier is valid.

8. In a memory having an array of memory cells, each memory cell for containing data therein; decoder means for selecting a memory cell in response to an address; a first sense amplifier for receiving data from the selected memory cell and for providing an output representative of the data received from the selected memory cell; a second sense amplifier for receiving the output of the first sense amplifier and for providing an output; an output driver for receiving the output of the second sense amplifier and for providing an output of the memory; a method for enabling and disabling the first and second sense amplifiers, comprising the steps of:

enabling the first sense amplifier in response to a transition of the address;
disabling the second sense amplifier for at least a predetermined time after the first sense amplifier has been enabled;
enabling the second sense amplifier after the predetermined time; and
disabling the first sense amplifier in response to detecting that the output of the second sense amplifier is valid.

9. The method of claim 8 further comprising the step of disabling the second sense amplifier in response to detecting that the output of the second sense amplifier is valid.

10. In a memory having an array of memory cells, each memory cell for containing data therein; decoder means for selecting a memory cell in response to an address; a first sense amplifier for receiving data from the selected memory cell and for providing an output representative of the data received from the selected memory cell; a second sense amplifier for receiving the output of the first sense amplifier and for providing an output; an output driver for receiving the output of the second sense amplifier and for providing an output of the memory; a control circuit for controlling the first and second sense amplifiers, comprising:

first control means for enabling the first sense amplifier in response to a transition of the address and disabling the first sense amplifier in response to the output of the second sense amplifier being valid; and
second control means for disabling the second sense amplifier for at least a predetermined time after the first sense amplifier has been enabled and enabling the second sense amplifier after the predetermined time.

11. The control circuit of claim 10, wherein the second control means is further characterized as disabling the second sense amplifier in response to the output of the second sense amplifier being valid.

12. The control circuit of claim 10, wherein the second control means is further characterized as clamping the output of the second sense amplifier to an invalid state in response to an address transition.

13. The control circuit of claim 12, wherein the second control means is further characterized as releasing the output of the second sense amplifier when the second sense amplifier is enabled.

14. The control circuit of claim 12, wherein the second control means is further characterized as disabling the second sense amplifier in response to the output of the second sense amplifier being valid.

15. A memory having an array of memory cells, each memory cell for containing data therein; decoder means for selecting a memory cell in response to an address; a first sense amplifier for receiving data from the selected memory cell and for providing an output representative of the data received from the selected memory cell; a second sense amplifier for receiving the output of the first sense amplifier and for providing an output; an output driver for receiving the output of the second sense amplifier and for providing an output of the memory, comprising:

detection means for providing a detection signal in response to the output of the second sense amplifier being valid;
first control means, coupled to the detection means and the first sense amplifier, for enabling the first sense amplifier in response to a transition of the address and disabling the first sense amplifier in response to the detection signal; and second control means, coupled to the second sense amplifier, for disabling the second sense amplifier for at least a predetermined time after the first sense amplifier has been enabled and enabling the second sense amplifier after the predetermined time.

16. The control circuit of claim 15, wherein the second control means is further characterized as disabling the second sense amplifier in response to the detection signal.

17. The control circuit of claim 15, wherein the second control means is further characterized as clamping the output of the second sense amplifier to an invalid state in response to an address transition.

18. The control circuit of claim 17, wherein the second control means is further characterized as releasing the output of the second sense amplifier when the second sense amplifier is enabled.

19. The control circuit of claim 17, wherein the second control means is further characterized as disabling the second sense amplifier in response to the detection signal.

* * * * *